United States Patent [19]

Masuno et al.

[11] Patent Number: 4,516,557

[45] Date of Patent: May 14, 1985

[54] IGNITION APPARATUS FOR INTERNAL COMBUSTION ENGINE

[75] Inventors: Katsuyoshi Masuno; Tsutomu Kamata, both of Hyogo, Japan

[73] Assignee: Mitsubishi Denki Kabushiki Kaisha, Tokyo, Japan

[21] Appl. No.: 486,277

[22] PCT Filed: Aug. 10, 1982

[86] PCT No.: PCT/JP82/00313

§ 371 Date: Mar. 2, 1983

§ 102(e) Date: Mar. 2, 1983

[87] PCT Pub. No.: WO83/00537

PCT Pub. Date: Feb. 17, 1983

[30] Foreign Application Priority Data

Aug. 10, 1981 [JP] Japan .......................... 56-119294[U]

[51] Int. Cl.3 .......................... F02P 1/00; H03F 1/00; H02K 11/00

[52] U.S. Cl. .................................... 123/619; 123/606

[58] Field of Search ............... 123/619, 651, 618, 617, 123/612; 321/208; 307/356; 331/465

[56] References Cited

U.S. PATENT DOCUMENTS

| | | | |
|---|---|---|---|
| 3,853,106 | 12/1974 | Canup | 123/606 |
| 3,961,613 | 6/1976 | Canup | 123/606 |
| 4,014,308 | 3/1977 | Schweitzer | 123/619 |
| 4,109,630 | 8/1978 | Richeson et al. | 123/619 |
| 4,109,632 | 8/1978 | Brooks | 123/619 |

FOREIGN PATENT DOCUMENTS

| | | | |
|---|---|---|---|
| 46-24806 | 7/1971 | Japan | 123/619 |
| 46-4430 | 11/1971 | Japan | 123/619 |

*Primary Examiner*—Raymond A. Nelli

*Attorney, Agent, or Firm*—Wenderoth, Lind & Ponack

[57] ABSTRACT

An ignition apparatus for an internal combustion engine which includes a signal rotor on a rotary shaft for being rotated in synchronism with a coil wound about a core, a metal heat sink, and a frame connected to the heat sink so as to form a casing. The frame has a recess opening to its interior and grooves extending into the recess. An integrated circuit is disposed on the heat sink. The integrated circuit includes a capacitor electrically connected to the core coil to form a resonance circuit, an oscillation energy supply circuit for supplying oscillation energy to the resonance circuit, an oscillation detector circuit for producing an output signal in response to the detection of the oscillation in the resonance circuit, an amplifier for amplifying the output signal, and a switch for interrupting the amplified signal. An ignition coil responds to interruption of the amplified signal by the switch for generating a high voltage. The core coil is electrically connected to the capacitor by electrical conductors including electrical lead wires which extend from the recess in the grooves formed therein.

5 Claims, 11 Drawing Figures

IGNITION APPARATUS FOR INTERNAL COMBUSTION ENGINE

BACKGROUND OF THE INVENTION

1. Field of the Invention

This invention relates to an ignition apparatus for an internal combustion engine in which a capacitor forming a resonance circuit is connected to a coil wound around a core opposite to a signal rotor to effect the detection of ignition timing by means of a change in the oscillation state.

2. Background Art

A previous apparatus of the type referred is shown in FIG. 1.

In the Figure, reference numeral (1) designates a signal generator unit disposed in a distributor (not shown), which unit includes a signal rotor (1*a*) rotated on a rotary shaft (1*a*′) in synchronism with an internal combustion engine (not shown), a core (1*b*) opposite the signal rotor (1*a*) and a coil (1*c*) wound around the core (1*b*). Reference numeral (2) is an electronic circuit unit disposed separately from the signal generator unit and including a capacitor (2*a*) forming a resonance circuit with the coil (1*c*), an oscillation energy supply circuit (2*b*) for supplying oscillation energy to this resonance circuit, an oscillation detecting circuit (2*c*) for detecting the oscillation status of said resonance circuit, an amplifying circuit (2*d*) for amplifying an output signal from the oscillation detecting circuit (2*c*), a power transistor (2*e*) driven with an output from the amplifying circuit (2*d*), and an electric source circuit (2*f*). Reference numeral (3) designates an ignition coil which includes a primary winding (3*a*) and a secondary winding (3*b*), and reference numeral (4) designates a battery.

The operation is described as follows. The signal rotor (1*a*) is rotated in synchronism with the internal combustion engine not shown to change the opposition of the core (1*b*) opposite the signal rotor (1*a*) to metallic portions on the signal rotor (1*a*) as shown in FIG. 2(*a*). On the other hand, the coil (1*c*) is wound around the core (1*b*) and the capacitor (2*a*) is connected to this coil (1*c*) to form the resonance circuit.

Supplied to this resonance circuit is oscillation energy from the oscillation energy supply circuit (2*b*) and in the state in which the opposition to the metal is absent as shown in FIG. 2(*a*), said resonance circuit has developed thereon a suitable oscillation waveform at an amplitude at which a loss of said resonance circuit is balanced with energy supplied by the oscillation energy supply circuit (2*b*) on the corresponding portion of FIG. 2(*b*). Also in the state in which the circuit is opposite to the metal, the metal exists in a magnetic path of a magnetic flux generated in the core (1*c*) and therfore due to a loss within the metal (the greater part of which is an eddy current loss and hysteresis loss), said oscillation is weak and finally results in its stoppage. As a result, said oscillation waveform presents a change as shown in FIG. 2(*b*). The oscillation detecting circuit (2*c*) always receives the oscillation waveform shown in FIG. 2(*b*) and, if the oscillation amplitude becomes larger than a comparison voltage as shown in FIG. 2(*b*), an output signal is generated as shown in FIG. 2(*c*). This output signal is amplified by the amplifying circuit 2(*d*) and drives the power transistor (2*e*). As a result, a current shown in FIG. 2(*d*) flows through the primary winding (3*a*) of the ignition coil (3), and upon interrupting this current, a high amplitude pulse voltage is generated as shown in FIG. 2(*e*). The secondary winding (3*b*) boosts the pulse voltage to provide a high voltage ignition pulse.

Since conventional ignition apparatuses are constructed as described above, it is required to connect the signal generator unit (1) to the electronic circuit unit (2) through leads having sufficient lengths. Because the oscillation waveform shown in FIG. 2(*b*) is of a high frequency in order to increase the response, there have been the disadvantages that the radiation of unnecessary electric waves is caused from said leads, the high voltage ignition pulses are induced on said leads resulting in the occurrence of malfunction, connecting portions become reduced in reliability, and so on.

SUMMARY OF THE INVENTION

The present invention provides an ignition apparatus for an internal combustion engine which can prevent faults such as the disconnection of leads for a coil during assembly, by having the leads penetrate the a groove portion on a frame upon the integration; the frame includes terminal plates. The apparatus is easily mass produced by effecting the connection of the leads for the coil through these terminal plates and is high in reliability and inexpensive.

DETAILED DESCRIPTION OF THE PREFERRED EMBODIMENT

Figure 1:
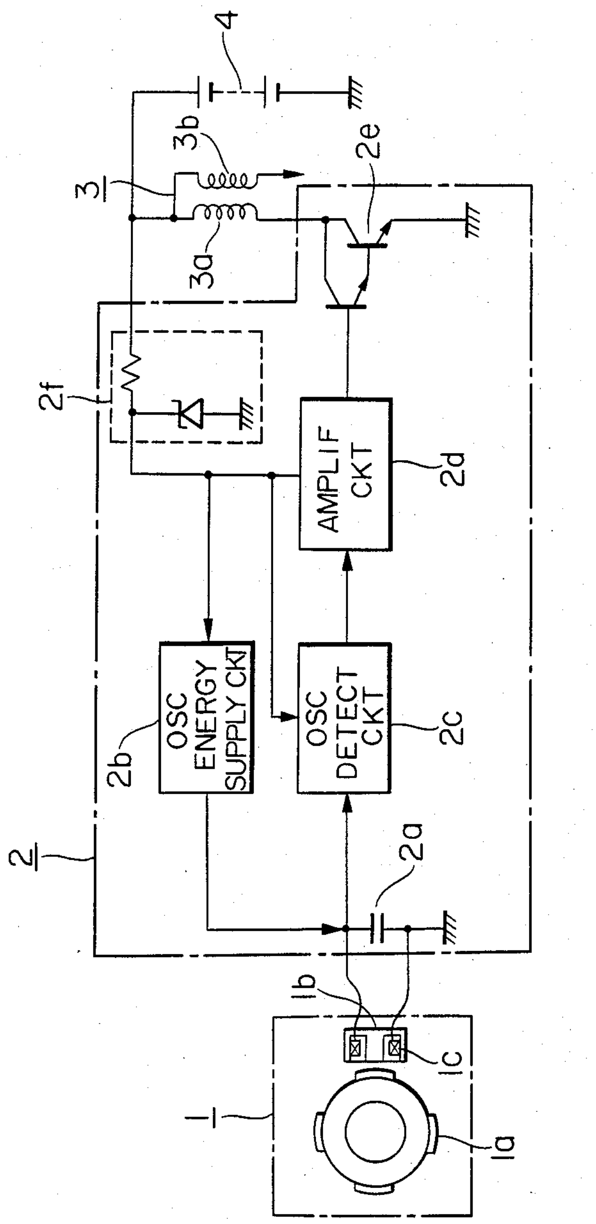
FIG. 1 is a block diagram illustrating a conventional ignition apparatus for an internal combustion engine.
Figure 2:
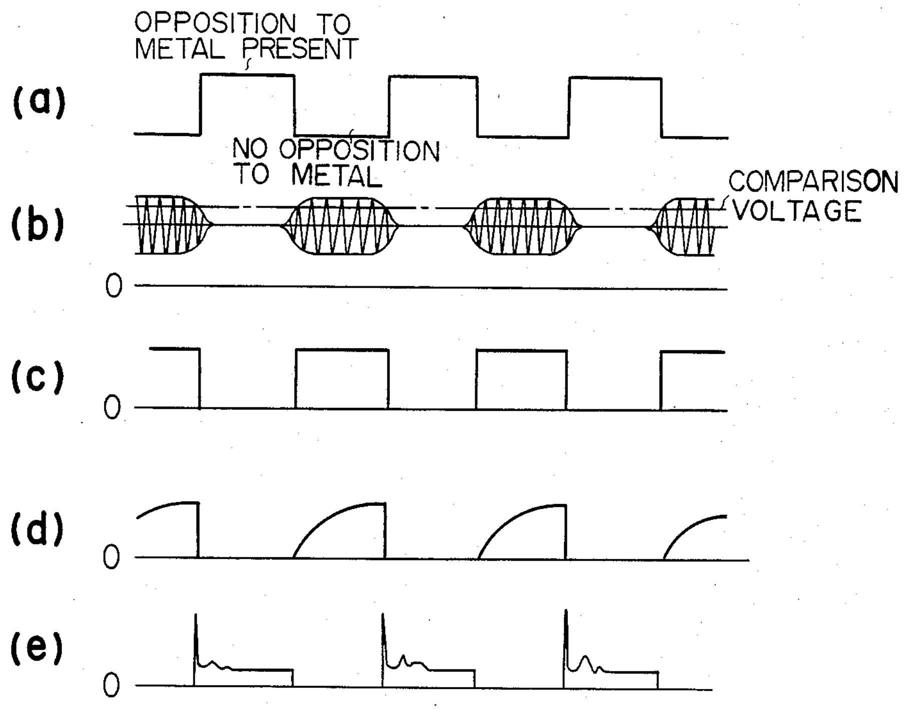
FIG. 2 is a waveform diagram illustrating operating waveforms thereof.
Figure 5:
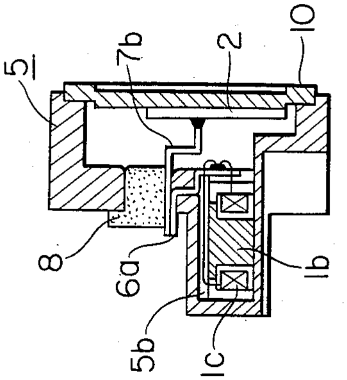
FIG. 5 is a sectional view along the line II—II of FIG. 3.
Figure 3:
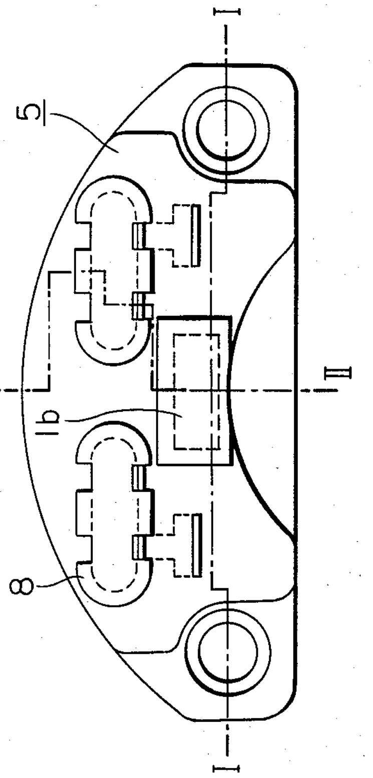
FIG. 3 is a front view illustrating an ignition apparatus for an internal combustion engine according to one embodiment of the present invention.
Figure 4:
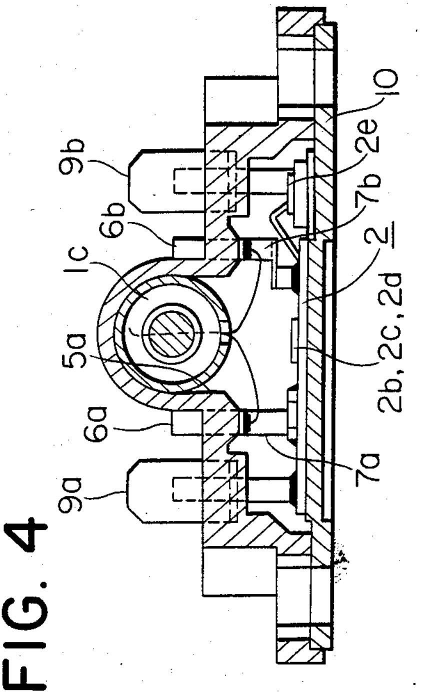
FIG. 4 is a sectional view along the line I—I of FIG. 3.
Figure 6:
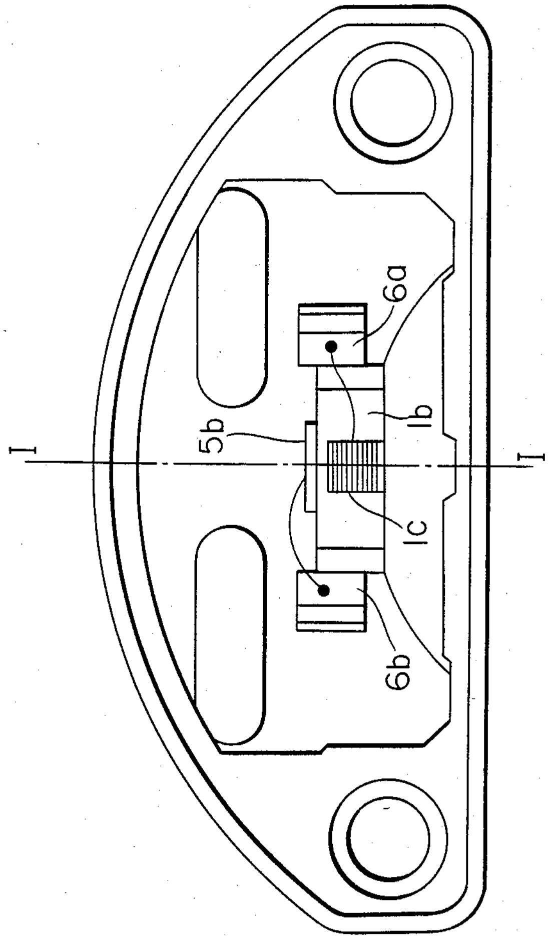
FIG. 6 illustrates the back of the frame portion shown in FIG. 3.
Figure 7:
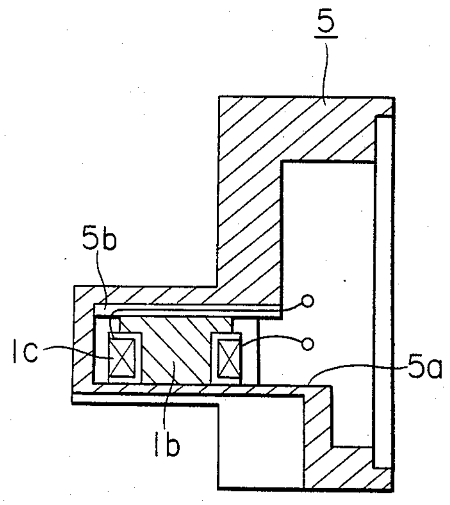
FIG. 7 is a sectional view along the line I—I of FIG. 6.

In FIG. 3, FIG. 4, FIG. 5, FIG. 6 and FIG. 7 reference numeral (1*b*) designates a core having a coil (1*c*) wound around the same. (2) An electronic circuit unit (2) is integrated with and disposed on a heat sink (10). A frame (5) forms a casing with said heat sink (10), which frame includes a recess (5*a*) into and on which said core (1*b*) is inserted and closely fitted and a groove portion (5*b*) into which leads for said coil (1*c*) penetrate. Reference Numbers (6*a*) and (6*b*) designate respective terminal plates to which the leads for said coil are connected on the inner side of said casing and also said electronic circuit unit (2) is connected through respective relaying leads (7*a*) and (7*b*). A sealing grummet (8) is pressed in and fixed to said frame, and connectors (9*a*) and (9*b*) are provided for connecting the exterior of said casing to said electronic circuit unit (2).

Regarding the operation, it is the same as the conventional examples but the coil (1*c*) is integrated with the electronic circuit unit (2) within said casing and the leads for the coil (1*c*) are extremely short. Accordingly, it is possible to cause the radiation of unnecessary electric waves from those leads to be substantially null.

Simultaneously, malfunction due to the induction of the high voltage ignition pulses can be prevented. The malfunction may include such things as the unexpected suspension or start of said oscillation and the electrical break-down of said oscillation energy supply circuit (*2b*) and/or said oscillation detecting circuit (*2c*). Since the electronic circuit unit (2) includes the power transistor (*2e*), said casing does not require any other electronic circuit other than the power transistor. Accordingly the electrical connection can be extremely easily effected and it is possible to simplify the apparatus. Also it is possible to make the reliability of the connecting portions high.

Also the frame 5 composing the casing has the groove portion (5*b*) in the recess (5*a*) for inserting and disposing the core (1*b*) into and on the same and faults such as the disconnection can be prevented by having the leads for the coil (1*c*) wound around the core (1*b*) penetrate this groove portion (5*b*). Also, where the groove portion (5*b*) is produced as by injection molding the frame (5), it is disposed in a direction identical to a split direction of a split mold. Thus, there is also the feature that the injection molding can extremely easily be carried out without the necessity of effecting a special working.

Furthermore, the frame (5) has the terminal plates (6*a*) and (6*b*), and by connecting the respective leads for the coil (1*c*) to these terminal plates (6*a*) and (6*b*) there is no danger of damage to said leads and others elements during the transportation and other handling after said coil (1*b*) and said coil (1*c*) have been inserted into and assembled in the frame (5). Also mass production can be extremely high in that the positioning is easy upon effecting the connection of the relaying leads (7*a*) and (7*b*), because the positions of the terminal plates (6*a*) and (6*b*) are fixed. Furthermore, it is possible to fix the core (1*b*) and the coil (1*c*) according to a method such as potting or the like.

We claim:

1. An ignition apparatus for an internal combustion engine, comprising:

- a rotary shaft for being rotated in synchronism with the internal combustion engine;
- a signal rotor mounted to said rotary shaft for being rotated therewith;
- a core opposing said signal rotor;
- a core coil wound about said core;
- a metal heat sink;
- a frame connected to said heat sink so as to form a casing having an interior, said frame having a recess opening into said interior, said frame having a grooved portion extending into said recess from said interior;
- an integrated circuit disposed on said heat sink, said integrated circuit including a capacitor electrically connected to said core coil to form a resonance circuit, oscillation energy supply means for supplying oscillation energy to said resonance circuit, oscillation detecting means, responsive to oscillation energy in said resonance circuit for producing a output signal, amplifier means for applifying said output signal to produced an amplified signal, and switch means for interrupting the amplified signal;
- ignition coil means, responsive to interruption of the amplified signal by said switch means, for generating a high voltage; and
- connecting means, including electrical lead wires connected at one end to said core coil and extending from said recess in said grooved portion, for electrically connecting said core coil to said capacitor.

2. An ignition apparatus as in claim 1, wherein said connecting means further comprises terminal plates electrically connecting said lead wires to said capacitor.

3. An ignition apparatus as in claim 1, wherein said interior comprises a space, said recess opening into said space, said integrated circuit and said recess being on opposite sides of said space; said connecting means including conductive members extending across said space electrically connecting said lead wires to said capacitor.

4. An ignition apparatus as in claim 3, wherein said conductive members comprise fixed terminal plates.

5. An ignition apparatus as in claim 4, wherein core coil is closely fitted in said recess.

* * * * *